United States Patent
Arimoto et al.

[11] Patent Number: 6,069,065
[45] Date of Patent: May 30, 2000

[54] SEMICONDUCTOR DEVICE FABRICATION METHOD

[75] Inventors: Satoshi Arimoto; Yoshitatsu Kawama, both of Tokyo, Japan

[73] Assignee: Mitsubishi Denki Kabushiki Kaisha, Tokyo, Japan

[21] Appl. No.: 08/936,435

[22] Filed: Sep. 24, 1997

[30] Foreign Application Priority Data

May 30, 1997 [JP] Japan .................................. 9-142377

[51] Int. Cl.⁷ .................................................. H01L 21/44
[52] U.S. Cl. .......................... 438/612; 438/688; 427/123; 427/282; 427/383.1
[58] Field of Search .................................. 438/612, 652, 438/72, 98, 688, 610; 427/58, 372.2, 428, 123, 282, 383.1

[56] References Cited

U.S. PATENT DOCUMENTS

| | | | |
|---|---|---|---|
| 5,279,682 | 1/1994 | Wald et al. | 438/98 |
| 5,320,684 | 6/1994 | Amick et al. | 438/98 |
| 5,421,908 | 6/1995 | Yoshida et al. | 438/98 |
| 5,609,694 | 3/1997 | Asai | 438/72 |
| 5,656,098 | 8/1997 | Ishikawa et al. | 427/221 |
| 5,665,607 | 9/1997 | Kawama et al. | 438/97 |
| 5,698,451 | 12/1997 | Hanoka | 438/688 |

FOREIGN PATENT DOCUMENTS 5-326990  12/1993  Japan .

*Primary Examiner*—Shrive Beck
*Assistant Examiner*—Bret Chen

[57] ABSTRACT

A semiconductor device fabrication method for simple and high-reliability electrode formation capable of increasing a bond strength with solder when performing wiring through soldering. To form an electrode on a semiconductor substrate having a junction, the pattern of an aluminum paste electrode having an opening is formed and thereafter, the pattern of a silver-aluminum paste electrode or silver paste electrode is formed on the opening so as to overlap with the pattern of the electrode. Thereby, it is possible to increase the bond strength with solder of the silver-aluminum paste electrode or silver paste electrode on the opening without being alloyed with the aluminum paste electrode. It is also possible to improve the certainty of the electrical connection between the electrodes because the overlap between the metallic paste patterns is alloyed.

17 Claims, 5 Drawing Sheets

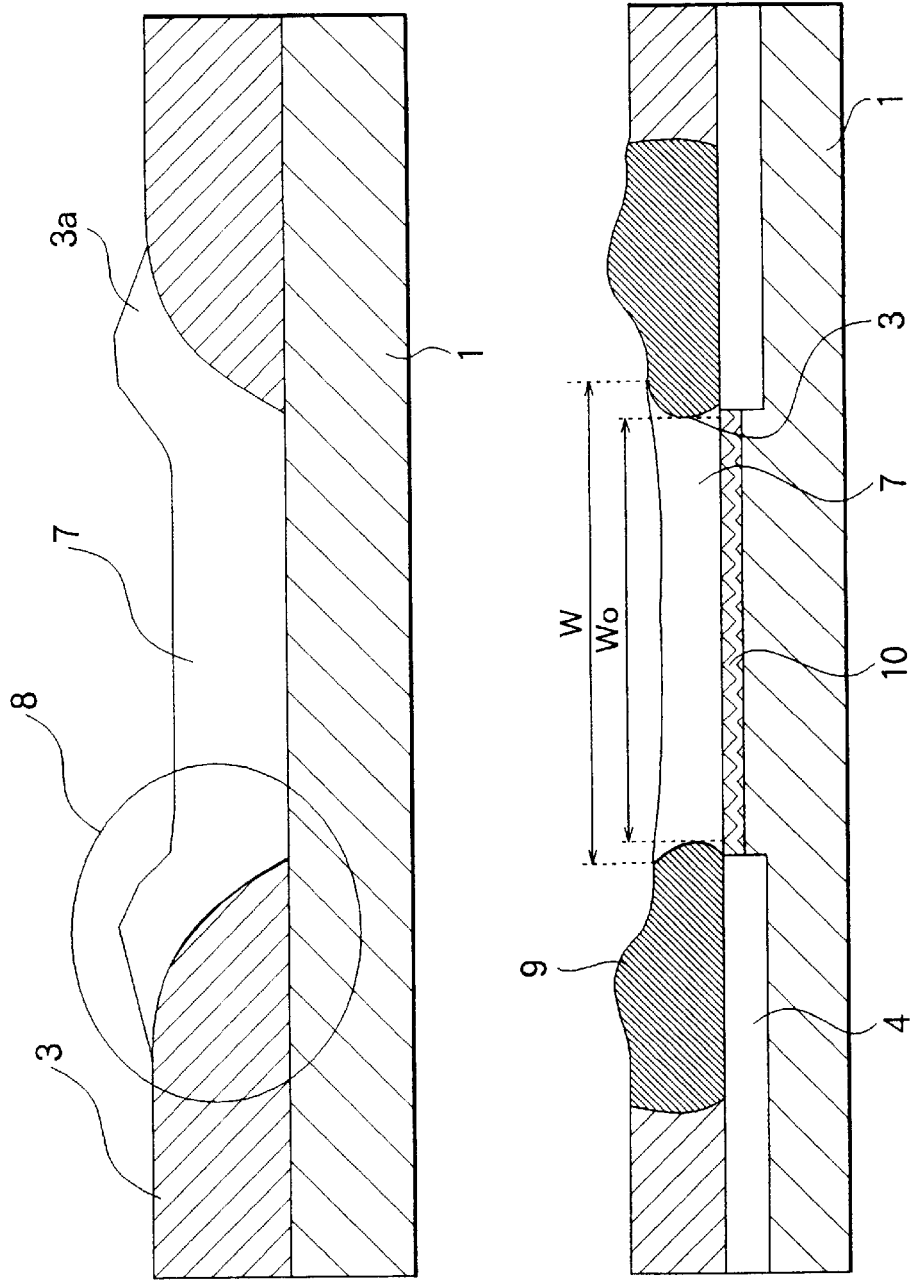

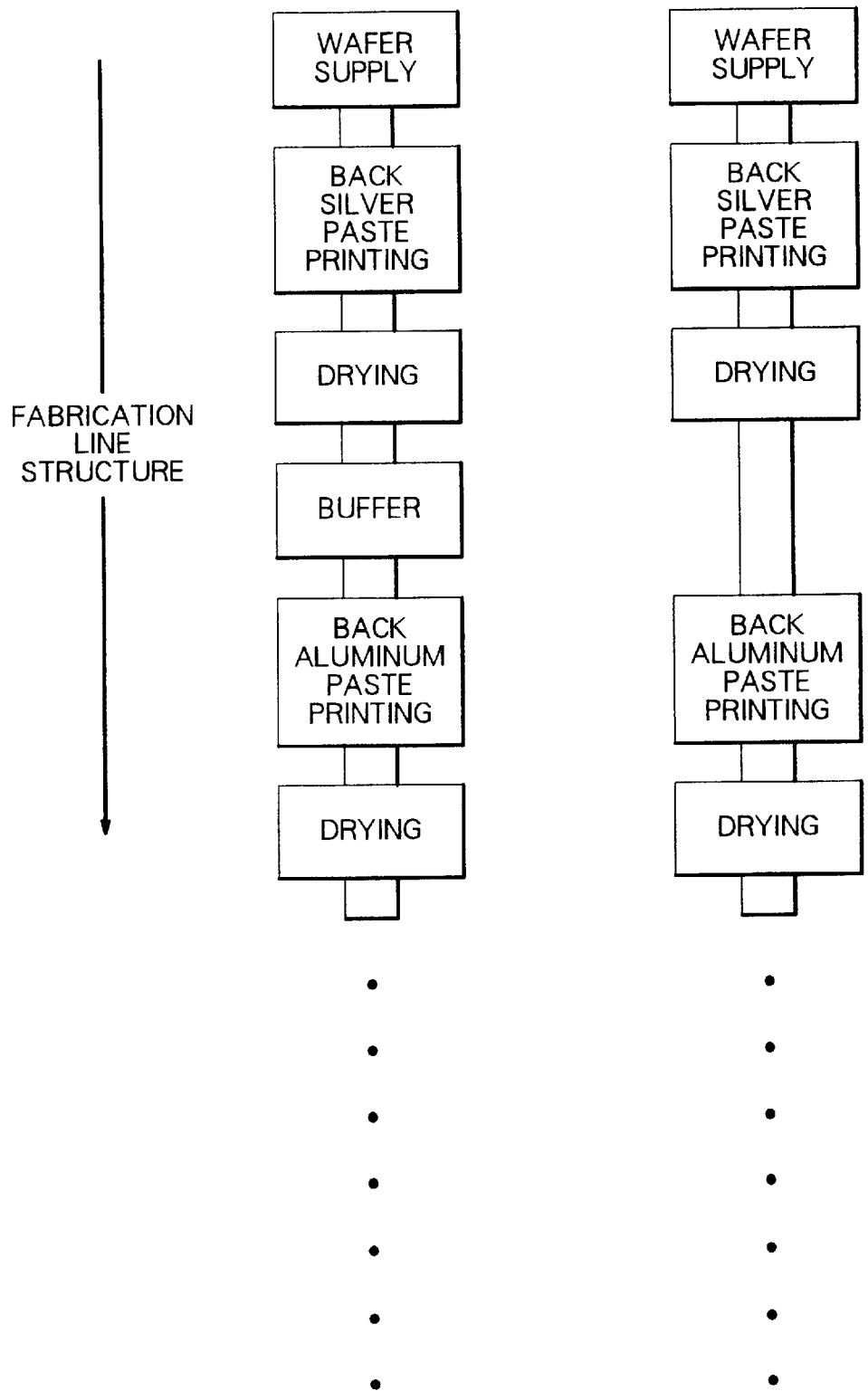

FIG. 5G PRIOR ART

SEMICONDUCTOR DEVICE FABRICATION METHOD

BACKGROUND OF THE INVENTION

1. Field of the Invention

The present invention relates to a semiconductor device fabrication method for forming an electrode with metallic paste, and more particularly to a semiconductor device fabrication method for simple and high-reliability electrode formation when using two or more types of metallic paste together.

2. Description of the Related Art

Though the present invention can be applied to various types of semiconductor devices, it is particularly effective for light receiving elements such as a photodiode and a solar cell. In this specification, a solar cell is taken as a specific example to describe the background of the present invention.

A silicon solar cell is the mainstream of solar cells for electric power and the process flow at its mass-production level is considerably simplified.

A conventional (known-art) semiconductor-device fabrication method is described below by referring to FIGS. 5A to 5J.

FIGS. 5A to 5J are a general solar-cell manufacturing flow.

In FIGS. 5A to 5J, symbol 1 denotes a p-type Si substrate serving as a semiconductor substrate to form an n-type diffusion layer 2 whose conducting type is reversed by thermally diffusing, for example, phosphorus (P) in FIG. 5B. Phosphorus oxychloride ($POCl_3$) is generally used as a phosphorus diffusion source. Moreover, when there is not any device, the n-type diffusion layer 2 is formed on the entire surface of the p-type Si substrate 1. The n-type diffusion layer 2 has a sheet resistivity of approx. tens of $\Omega z,1$ and a depth of 0.3 to 0.5 $\mu$m.

The n-type diffusion layer 2, though details are omitted, is removed through etching so as to leave the n-type diffusion layer 2 only on one principal plane as shown in FIG. 5C after protecting either plane by, for example, resist and removing the resist by an organic solvent or the like.

Thereafter, aluminum diffuses into the p-type Si substrate 1 from aluminum paste as impurities and a $p^+$ layer 4 containing high-concentration impurities is formed as shown in FIG. 5E by printing an aluminum paste electrode 3 on the plane opposite to the n-type diffusion layer 2 in FIG. 5C by, for example, the screen printing method (or roll coater method)(refer to FIG. 5D) and baking the electrode 3 in a near-infrared oven for several minutes to tens of minutes at 700° to 900° C.

This layer is generally referred to as a BSF (Back Surface Field) layer and contributes to the improvement of the energy conversion efficiency of a solar cell. Moreover, thereafter, it is possible to form an antireflection film on the surface of the n-type diffusion layer 2 though the illustration is omitted for simplification.

FIG. 5F shows a state of printing and drying a sliver paste electrode 5 without removing the aluminum paste electrode 3 on the back.

Moreover, FIG. 5H shows a state of removing the aluminum paste electrode 3 on the back by, for example, aqua regia and FIG. 5I shows a state of continuously printing and drying the silver paste electrode 5 on the back. These silver paste electrodes 5 on the back are made to function as wiring joints when fabricating a module constituted by connecting a plurality of solar cells in series and parallel. Finally, a solar cell is completed by printing the silver paste electrode 6 on the surface (light-receiving plane) and baking it again in any process and in FIGS. 5G and 5J. Moreover, it is possible to complete a solar cell by omitting the baking process in FIG. 5E for process simplification and performing one-time baking after the processes in FIGS. 5G and 5J.

However, a silicon solar cell manufactured as described above has the following problems on the back-electrode forming method.

For example, in the case of the method starting with FIGS. 5A to 5E and ending with FIGS. 5F and 5G, if the aluminum paste electrode 3 and the silver paste electrode 5 are alloyed in the electrode baking process, a problem occurs that solder does not attach the wiring at all due to alloying with aluminum when soldering the wiring with the silver paste electrode 5 or the wiring bond strength is small even if solder attaches the wiring.

Moreover, in the case of the method starting with FIGS. 5A to 5E and ending with FIGS. 5H and 5J, it is necessary to remove every aluminum paste electrode 3 through etching. Therefore, problems occur that processes become complex and the manufacturing cost increases.

SUMMARY OF THE INVENTION

The present invention is made to solve the problems of the above conventional example and its object is to provide a semiconductor device fabrication method for simple and high-reliability electrode formation capable of increasing a bond strength with solder when performing wiring through soldering.

To achieve the above object, a semiconductor device fabrication method of the present invention uses a semiconductor device fabrication method for forming an electrode on a semiconductor substrate having a junction and comprises the steps of forming a first electrode pattern having a predetermined opening by using first metallic paste for a substrate and forming a second electrode pattern on the opening so as to overlap with the first metallic paste around the opening by using second metallic paste having a bond strength with solder higher than that of the first metallic paste after forming the first electrode pattern.

Moreover, the first metallic paste uses aluminum paste, the second metallic paste uses silver paste or silver-aluminum paste containing silver and aluminum, and these pastes are used by combining two types or more among the above types of paste.

Furthermore, the first electrode pattern made of aluminum paste is formed and thereafter, the second electrode pattern made of silver paste is formed so as to overlap with the electrode pattern made of aluminum paste.

Furthermore, the first electrode pattern made of aluminum paste is formed and thereafter, the second electrode pattern made of silver-aluminum paste is formed so as to overlap with the electrode pattern made of aluminum paste.

Furthermore, in the case of the first and second electrode patterns, metallic paste is formed by the screen printing method or roll coater method and the width of the overlap between the first and second electrode patterns is set to 50 $\mu$m or more.

Furthermore, the process for forming the first and second electrode patterns includes a process for printing and drying the first and second metallic-paste patterns independently each other and further includes a process for simultaneously baking the patterns after passing through the printing and drying processes.

Furthermore, a process for applying wiring to the second electrode pattern by soldering is further included.

Furthermore, the semiconductor substrate is made of silicon.

BRIEF DESCRIPTION OF THE DRAWINGS

FIGS. 3A and 3B are sectional views for explaining electrode forming states according to the embodiment 1 of the present invention;

FIGS. 4A and 4B are illustrations of the fabrication line structure for electrode formation according to the embodiment 2 of the present invention; and FIGS. 5A to 5J are process diagrams showing the fabrication flow of a solar cell which is known but unembodied.

DESCRIPTION OF THE PREFERRED EMBODIMENTS

Figure 1:
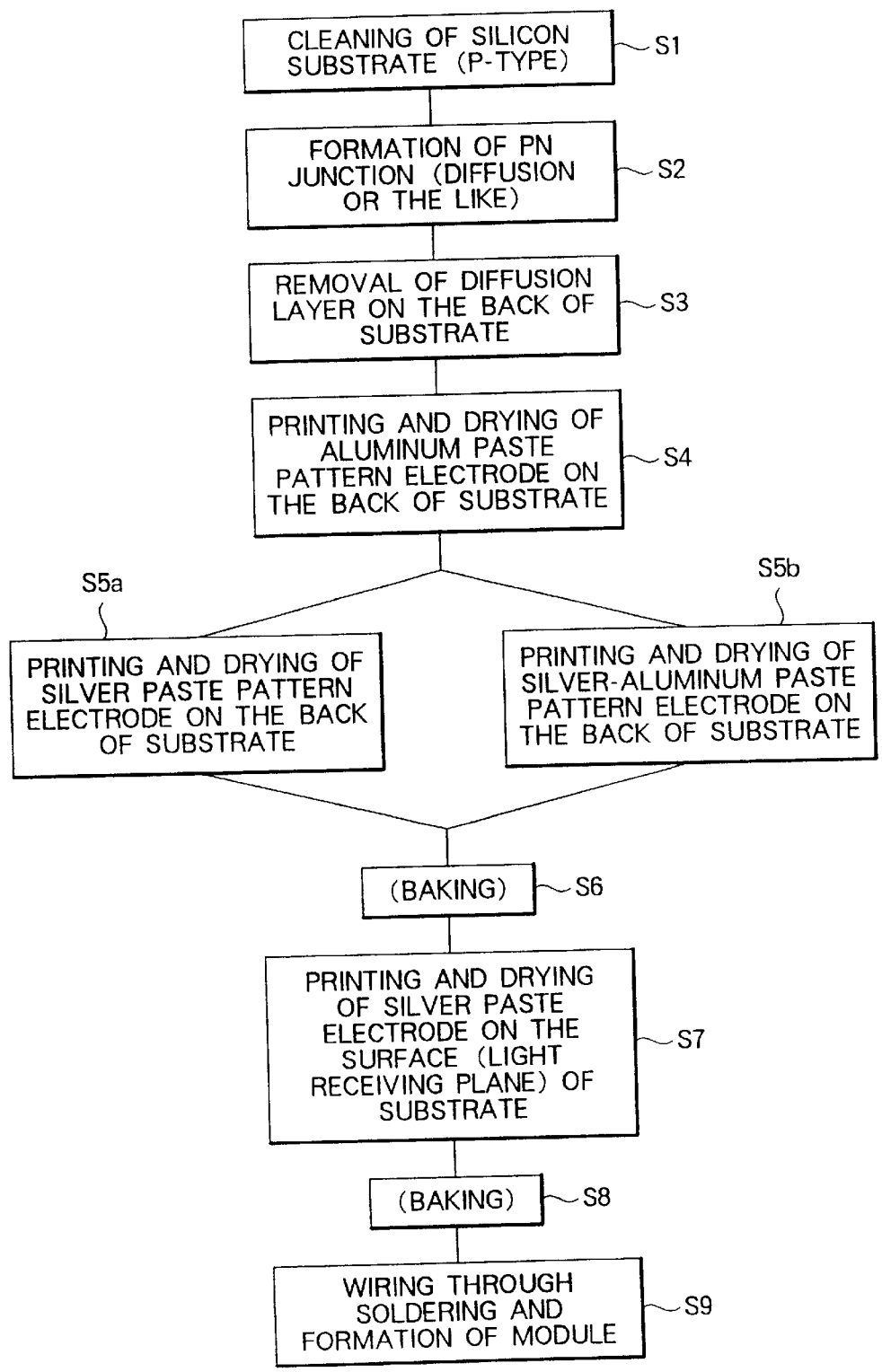
FIG. 1 is a flow chart for explaining the semiconductor device fabrication method of embodiments 1 and 2 of the present invention.

Flow charts related to semiconductor device fabrication methods of the present invention are summarized as FIG. 1. The preferred embodiments are described below by referring to the flow chart. The process flow is not restricted to one semiconductor device. Hereafter, description is made by taking a solar cell as a specific example.

Embodiment 1

In the case of the embodiment 1, a solar cell and a solar cell module manufactured by the flow of step S1-step S2-step S3-step S4-step S5b-(step S6)-step S7-step S8-step S9 are described by referring to the flow chart in FIG. 1. In this case, the baking process in parenthesized step S6 can be omitted for process simplification because of the same reason as described in the known art and it is possible to perform one-time baking in step S8 after the process of step S7.

First, the process of step S1 shown in FIG. 1 is a process for cleaning a single-crystal silicon substrate manufactured by, for example, the pulling method or polycrystal silicon substrate manufactured by the casting method. In the case of a solar cell, however, a substrate directly sliced from ingot is frequently used.

In this case, the substrate surface is etched up to 10 to 20 μm by using an alkaline aqueous solution such as a potassium-hydroxide aqueous solution or sodium-hydroxide aqueous solution or a mixed solution of hydrofluoric acid and nitric acid in order to remove a substrate surface damage due to a scratch by a wire saw used for slicing and contamination in the wafer slicing process. Moreover, to remove heavy metals including iron from the substrate surface, it is possible to add a process for cleaning the substrate by a mixed solution of hydrochloric acid and hydrogen peroxide.

Continuously in the process of step S2, an n-type layer is formed to form a pn junction if the substrate to be used is p-type. To form the n-type layer, phosphorus diffusion by phosphorus oxychloride ($POCl_3$) described in FIG. 5B is used.

Figure 5A:
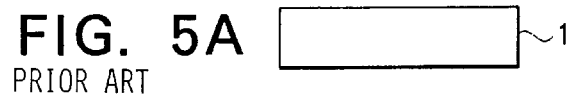
Figure 5B:
Figure 5C:
Figure 5D:
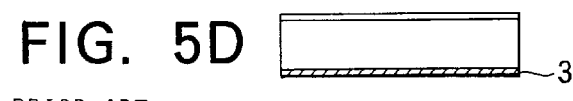
Figure 5E:
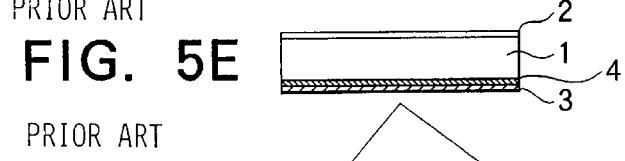
Figure 5F:
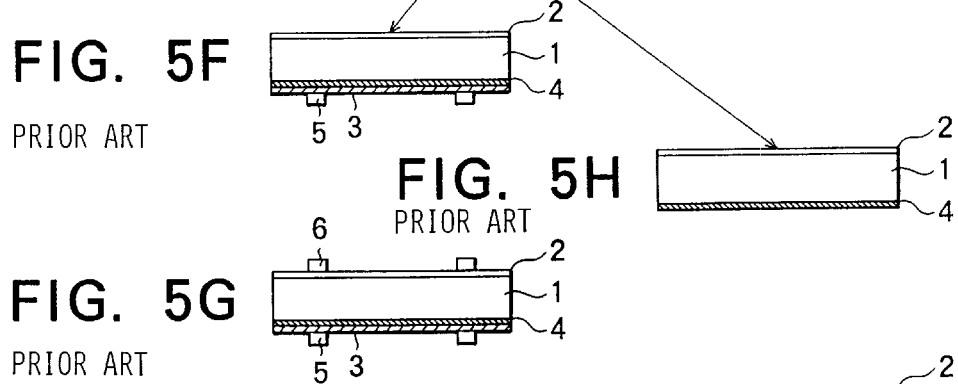
Figure 5H:
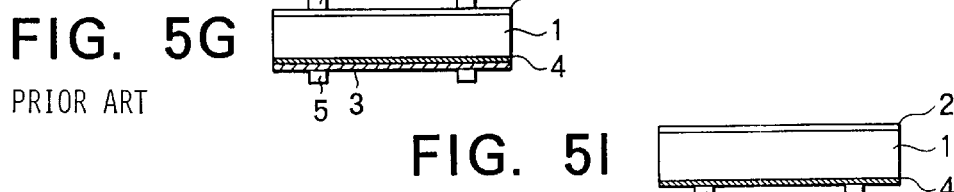
Figure 5I:
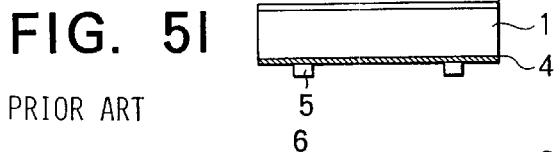

Removal of the back diffusion layer in the process of step S3 can be performed in accordance with the flow described in FIG. 5C. For example, either side of the layer is protected by resist and then removed through etching so as to leave the n-type diffusion layer only on the surface, and the resist is removed by an organic solvent.

The process of step S4 is a process for printing and drying the aluminum paste electrode 3 on the back and the process of step S5b after step S4 is a process for printing and drying a silver-aluminum paste electrode 7 containing aluminum and having a bond strength with solder higher than that of the aluminum paste electrode 3.

The silver-aluminum paste electrode 7 contains 1 to 3% of aluminum. Addition of more than 3% aluminum is generally avoided because soldering, to be described below, becomes difficult.

These metallic-paste electrodes are printed by the general screen-printing method (or roll coater method). As printing conditions, the viscosity of any paste was set to approx. 100 Pa·sec, the squeegee pressure under printing was set to 2 kg/cm², the squeegee scanning rate was set to 300 mm/sec, and the interval between a squeegee and a printing mask was set to 2 mm.

Moreover, as a mesh size of the printing mask, a mask of 200 meshes was used for the aluminum paste electrode 3 arid a mask of 250 to 325 meshes was used for the silver-aluminum paste electrode 7 (and a silver paste electrode 5 to be described later).

Figure 2A:
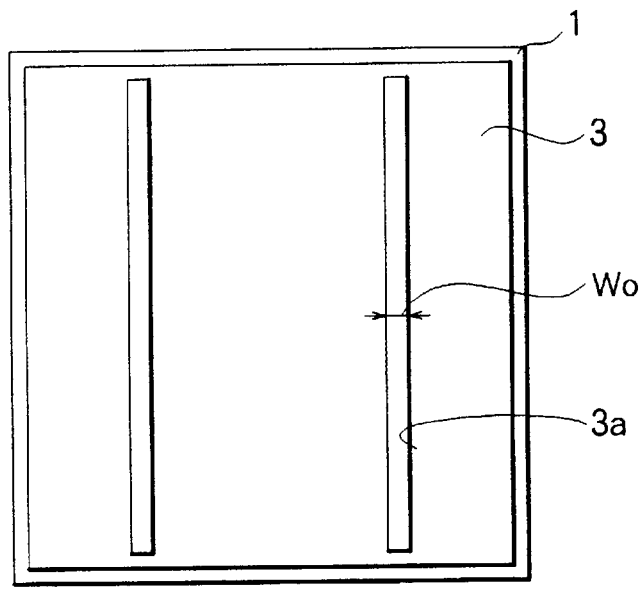
FIGS. 2A and 2B are illustrations showing an electrode pattern of the embodiment 1 of the present invention.
Figure 2B:
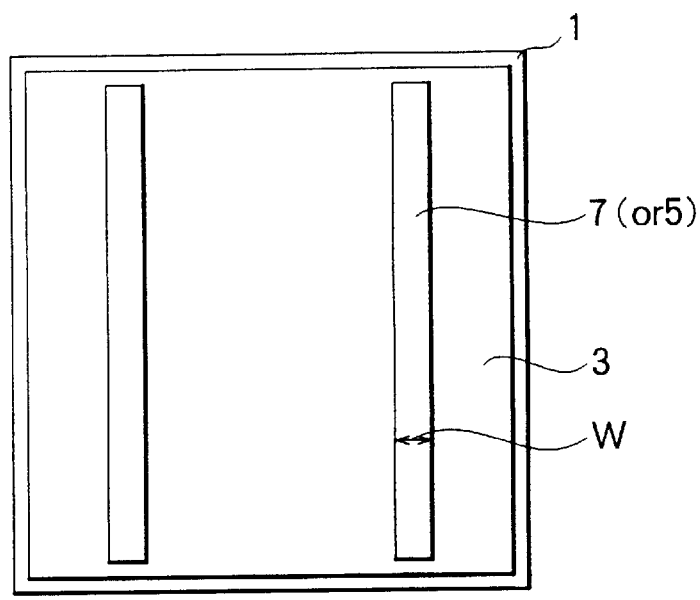

FIGS. 2A and 2B show specific electrode patterns.

In this case, though the p-type Si substrate 1 is equal to that in FIG. 5A, it is necessary to set the substrate size to, for example, 10 cm×10 cm. Moreover, the pattern of the aluminum paste electrode 3 has an outer periphery of, for example, 9.8 cm×9.8 cm and an opening 3a of 9.4 cm×0.3 cm at two places at its center.

FIG. 2B shows a state of printing the pattern of the silver-aluminum paste electrode 7 (or silver paste electrode 5) at the opening 3a of the pattern of the aluminum paste electrode 3 so as to overlap with the aluminum paste electrode 3 around the opening. The pattern of the silver-aluminum paste electrode 3 has a size of 9.5 cm×0.4 cm. That is, the overlap between the pattern of the silver paste electrode 3 and that of the silver-aluminum paste electrode 7 (or silver paste electrode 5) was set to 500 μm.

For the width of the overlap, an overlap width of 50 μm or more on mask patterns is necessary to securely overlap two types of paste each other because a printing mask has a pattern accuracy of approx. 20 μm.

In the case of the embodiment 1, an overlap width of 50 μm is secured because patterns do not requires an overlap accuracy. When a fine pattern is required, it is necessary to design an electrode pattern by adequately considering the above minimum overlap width.

Figure 5J:
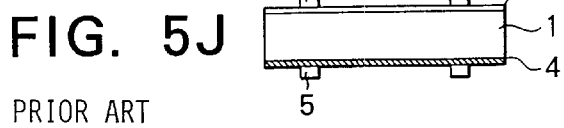

Then, the process of step S7 is a process for printing and drying the silver paste electrode 6 on the light receiving side similarly to the case of FIG. 5G or 5J.

Thereafter, in the process of step S8, all electrodes are simultaneously baked. It is necessary to bake the electrodes for tens of seconds to several minutes at 700 to 750° C. in dry air by using a near-infrared oven.

FIGS. 3A and 3B schematically show how an electrode changes after passing through the process.

FIG. 3A shows a state of overlapping the aluminum paste electrode 3 with the silver aluminum paste electrode 7 and printing them. In FIG. 3A, symbol 8 denotes the overlap. It is a matter of course that both paste electrodes are not electrically connected under the directly dried state. FIG. 3B shows a state after baking them. In FIG. 3B, symbol 9 denotes a region in which both paste electrodes are alloyed. In this region, the aluminum paste electrode 3 and the silver-aluminum paste electrode 7 are completely mixed each other and a silver-aluminum alloy containing high-concentration aluminum is formed.

Thereby, both types of paste are connected to each other without any electrical or strength problem. Moreover, in FIG. 3B, symbol 4 denotes the BSF layer previously described. Furthermore, a diffusion layer 10 in which aluminum diffuses at a low concentration is formed immediately under the silver-aluminum paste electrode 7 which is left without being alloyed. The region of the diffusion layer 10 has a secure ohmic-contact with the silver-aluminum paste electrode 7 and though aluminum diffuses at a low concentration compared to the case of the bottom of the aluminum paste electrode 3 and thus, effectively works on the decrease of the contact resistance of the back electrode of a solar cell.

Continuously in the process of step S9, the silver paste electrode 6 on the light-receiving plane (surface) of a solar cell is properly connected with the silver-aluminum paste electrode 7 on the back of the solar cell in series and parallel through soldering by using a copper wire. Thereafter, by covering the solar cell with tempered glass such as ethylene vinyl acetate, a solar cell module is completed.

In the case of a back electrode structure of the present invention, the silver-aluminum paste electrode 7 to be soldered closely contacts a substrate (in this case, the diffusion layer 10) and the aluminum paste electrode 3 at a very high strength. Therefore, the electrodes are not removed and it is possible to manufacture a high-reliability solar-cell module at a high yield.

Moreover, because the silver-aluminum paste electrode 7 to be soldered is formed on the opening 3a of the aluminum paste electrode 3, it is possible to improve the bond strength with solder without being influenced due to alloying with aluminum. Furthermore, it is possible to easily perform soldering for wiring because a width W larger than the width $W_0$ of the opening 3a of the aluminum paste electrode 3 can be secured as shown in FIGS. 2A and 2B and FIG. 3B.

Embodiment 2

In the case of the embodiment 2, a solar cell and a solar-cell module are described below which are manufactured in accordance with the flow of step S1-step S2-step S3-step S4-step S5a-(step S6)-step S7-step S8-step S9 in the flow chart in FIG. 1.

The embodiment 2 shows the same advantage as the embodiment 1 only by changing the silver-aluminum paste electrode 7 serving as a back electrode to the silver paste electrode 5 (see FIG. 2). In this case, though the aluminum diffusion layer 10 described in FIG. 3B is not formed, the contact resistance of the back electrode is prevented from increasing by making the region of the aluminum paste electrode 3 large enough.

Moreover, in the case of the embodiments 1 and 2, it is possible to replace the printing sequence of the aluminum paste electrode 3 on the back of the substrate with that of the silver paste electrode 5 or silver-aluminum paste electrode 7. However, to increase the area on which the BSF layer 4 is formed (to improve the solar cell characteristic), it is preferable to first print the aluminum paste electrode 3 like the case of the embodiment 2.

That is, because the BSF layer 4 is formed by completely mixing aluminum with silicon and crystallizing them, the BSF layer 4 can be more preferably formed by bringing the aluminum paste electrode 3 into contact with a silicon plane at the overlap between aluminum paste and other paste.

Moreover, even if the diffusion layer on the back is incompletely removed in the process of step S3, the diffusion layer (n layer) is compensated by aluminum diffusion, the area to be converted to the p type is also increased, and a high-reliability product can be manufactured because the contact area of the aluminum paste electrode increases. Furthermore, the bond strength of an electrode is improved because the overlap between aluminum paste and other paste is mixed with a silicon substrate and crystallized. That is, it is possible to further increase the strength of the wiring between solar cells.

Furthermore, when actually considering the productivity in mass production, the following superior feature is shown. That is, the difference between productivities after replacing the printing sequence of the aluminum paste electrode 3 on the back with that of the silver paste electrode 5 (or silver-aluminum paste electrode 7) on the back is described below by referring to FIGS. 4A and 4B.

FIG. 4A shows the process for forming the silver paste electrode 5 for the back and the aluminum paste electrode 3 for the back, in which it is assumed that all apparatuses are basically directly connected to each other, various processes including printing and wafer drying are provided with an automation system, and treatments are performed continuously and automatically.

In this case, a case is assumed in which the printing patterns shown in FIGS. 2A and 2B are formed as back electrodes. The ratio between the areas of two electrode patterns, that is, the ratio of the area of the aluminum paste electrode 3 to the area of the silver paste electrode 5 becomes approximately 12.

This corresponds to the fact that the amount of the aluminum paste electrode 3 to be used is 12 times larger than the amount of the silver paste electrode 5 to be used when simply assuming that the printing thicknesses of the electrode patterns are equal. When using the screen printing mask with the mesh size shown in the embodiment 1, the amount of the aluminum paste electrode 3 to be used further increases because the printing thickness of the aluminum paste electrode 3 practically becomes larger than that of the silver paste electrode 5.

This difference influences the production Takt (speed at which parts must be anufactured in order to satisfy demand) in the automated line shown in FIG. 4A. When a plurality of sheets are continuously printed, it is a matter of course that the paste being supplied onto a screen mask is insufficient or meshes of the mask are clogged and thereby, a thin spot is produced in a predetermined printing pattern.

Therefore, it is always necessary to replenish paste or change printing masks at or before the above stage.

The above-described difference between the amounts of paste to be used for various printing patters appears as the difference between these operation frequencies. That is, the aluminum paste printing using a lot of paste represents that the frequency of these operations is high.

Therefore, when setting the process for printing the silver paste electrode 5 for the back to the first step, it is necessary to use a wafer stocker section, that is, a buffer zone for absorbing the downtime in the process for printing the aluminum paste electrode 3 for the back and a complex line structure for minimizing the downtime of the process for printing the silver paste electrode 5 for the back.

FIG. 4B shows a process for forming the aluminum paste electrode 3 for the back and the silver paste electrode 5 for the back in the printing sequence of the present invention.

In this case, a buffer for adjusting the Takt of subsequent processes is not necessary because the process for printing the aluminum paste electrode 3 for the back most dominating the production Takt in a continuous process is set to the first step. Thereby, the line structure is simplified and it is possible to construct a line having a low manufacturing cost.

Moreover, when printing the silver paste electrode 5 and thereafter printing the aluminum paste electrode 3, the width of the silver paste electrode 5 is decreased due to alloying with the aluminum paste electrode 3. In the case of the embodiment 2, however, a width W larger than the width $W_0$ of the opening 3a of the aluminum paste electrode 3 can be secured as the width of the silver paste electrode 5 to be soldered as shown in FIGS. 2A and 2B and FIG. 3B. Therefore, it is possible to simplify the soldering for wiring.

As described above, the present invention not only can be applied to the improvement of the known art, that is, the improvement of the conventional method for forming the electrode of a solar cell but also can be widely applied to semiconductor devices using a metallic paste electrode.

Thus, functions and advantages of a semiconductor device fabrication method of the present invention are listed below.

According to the present invention, a semiconductor device fabrication method for forming an electrode on a semiconductor substrate having a junction comprises the steps of forming a first electrode pattern having a predetermined opening by using first metallic paste for a substrate and forming a second electrode pattern on the opening so as to overlap with the first metallic paste around the opening by using second metallic paste having a bond strength with solder higher than the first metallic paste. Thereby, to form an electrode by using metallic paste, it is possible to increase the bond strength of the second metallic paste to be formed on the opening with solder without being alloyed with the first metallic paste when performing wiring through soldering, securely improve the connection between electrodes because the overlap between various types of metallic paste is alloyed and thereby, electrode patterns are electrically connected to each other. Thus, it is possible to simplify fabrication processes and provide a semiconductor device fabrication method realizing simple and high-reliability electrode formation.

Moreover, the first metallic paste uses aluminum paste and the second metallic paste uses silver paste or silver-aluminum paste containing silver and aluminum. Therefore, it is possible to decrease the fabrication cost by combining two or more types of paste among the above types of paste.

Furthermore, by forming the first electrode pattern made of aluminum paste and thereafter forming the second electrode pattern made of silver paste so as to overlap with the aluminum-paste electrode pattern, it is possible to improve the reliability of formed electrodes and simplify fabrication processes.

Furthermore, by forming the first electrode pattern made of aluminum paste and thereafter forming the second electrode pattern made of silver-aluminum paste so as to overlap with the aluminum-paste electrode pattern, it is possible to improve the reliability of formed electrodes, further decrease the contact resistance of electrodes, and moreover simplify fabrication lines.

Furthermore, it is possible to form the first and second electrode patterns at a high accuracy by forming metallic paste by the screen printing method or roll coater method and setting the width of the overlap between the first and second electrode patterns to 50 $\mu$m or more.

Furthermore, the process for forming the first and second electrode patterns includes processes for independently printing and drying the first and second metallic paste patterns to be formed so as to overlap each other and moreover includes a process for simultaneously baking the patterns after passing through the printing and drying processes. Therefore, the overlap between the metallic-paste electrode patterns is alloyed and the electrode patterns are electrically connected each other. Thus, it is possible to improve the certainty of connection between electrodes.

Furthermore, because a process for applying wiring to the second electrode pattern through soldering is further included, it is possible to increase the bond strength of wiring by applying wiring to a silver-aluminum paste or silver paste pattern through soldering when connecting a plurality of semiconductor devices fabricated by the above method.

Furthermore, because the semiconductor substrate is made of silicon, it is possible to mass-produce semiconductor devices at a low cost.

What is claimed is:

1. A semiconductor device fabrication method for forming an electrode on a semiconductor substrate having a junction, the method comprising the steps of:

forming a first electrode pattern having a predetermined opening on a surface of the substrate using a first aluminum metallic paste; and forming a second electrode pattern on said opening so as to overlap with said first aluminum metallic paste around the opening by using a second aluminum metallic paste having a bond strength with solder higher than that of the first aluminum metallic paste.

2. The semiconductor device fabrication method according to claim 1, wherein said first aluminum metallic paste is aluminum paste and said second aluminum metallic paste is silver-aluminum paste containing silver and aluminum.

3. The semiconductor device fabrication method according to claim 1, wherein said first and second electrode patterns are constituted by forming aluminum metallic paste by at least one of screen printing method or roll coater method and setting a width of the overlap between the first and second patterns to at least 50 $\mu$m.

4. The semiconductor device fabrication method according to claim 1, wherein the step of forming said first and second electrode patterns includes the steps of independently printing and drying first and second metallic paste patterns to be formed so as to overlap with each other and further includes the step of simultaneously baking the patterns after passing through the printing and drying steps.

5. The semiconductor device fabrication method according to claim 1, further including the step of applying wiring to said second electrode pattern through soldering.

6. The semiconductor device fabrication method according to claim 1, wherein said semiconductor substrate is made of silicon.

7. A semiconductor device fabrication method for forming an electrode on a semiconductor substrate, said substrate having a junction at a light receiving surface thereof and a back surface opposite to said light receiving surface, the method comprising the steps of:

applying a first aluminum metallic paste to the back surface of the substrate to form a first electrode pattern, the first electrode pattern contacting the substrate at first electrode contact regions separated by an opening;

applying a second aluminum metallic paste having a lower concentration of aluminum than the first metallic paste to the back surface of the substrate at the opening to form a second electrode pattern, the second electrode pattern contacting the substrate at a second electrode contact region; and bonding solder to said second electrode pattern.

8. The semiconductor device fabrication method according to claim 7, wherein the concentration of aluminum of the second metallic paste is 1% to 3%.

9. The semiconductor device fabrication method according to claim 7, wherein the second aluminum metallic paste is silver-aluminum paste.

10. The semiconductor device fabrication method according to claim 7, wherein the second electrode pattern overlaps the first electrode pattern.

11. The semiconductor device fabrication method according to claim 7, further comprising the step of alloying the first and second electrode patterns.

12. The semiconductor device fabrication method according to claim 7, further comprising the step of baking the semiconductor device to thermally diffuse impurities into the substrate at the first electrode contact regions and the second electrode region.

13. The semiconductor device fabrication method according to claim 12, wherein the concentration of impurities at the first electrode contact regions is higher than the concentration of impurities at the second electrode contact region.

14. The semiconductor device fabrication method according to claim 7, further comprising the step of applying a silver metallic paste to the light receiving surface of the substrate to form a third electrode pattern.

15. The semiconductor device fabrication method according to claim 14, wherein the second aluminum metallic paste is formed by combining at least the first aluminum metallic paste and the silver metallic paste.

16. The semiconductor device fabrication method according to claim 14, further comprising the step of electrically connecting the third electrode pattern to the second electrode pattern.

17. The semiconductor device fabrication method according to claim 7, further comprising the step of simultaneously baking the first and second electrode patterns.

* * * * *